(12) United States Patent
Yoshimoto

(10) Patent No.: US 6,356,508 B1
(45) Date of Patent: Mar. 12, 2002

(54) SEMICONDUCTOR STORAGE DEVICE

(75) Inventor: Takahiko Yoshimoto, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/715,304

(22) Filed: Nov. 16, 2000

(30) Foreign Application Priority Data

Nov. 30, 1999 (JP) .......................................... 11-341465

(51) Int. Cl.[7] ................................................ G11C 8/00

(52) U.S. Cl. ............. 365/233; 365/189.05; 365/189.08; 365/230.08

(58) Field of Search ........................... 365/233, 230.08, 365/189.05, 189.08

(56) References Cited

U.S. PATENT DOCUMENTS

| | | | | |
|---|---|---|---|---|
| 5,627,795 A | * | 5/1997 | Nitta ........................... | 365/233 |
| 5,648,931 A | | 7/1997 | Obara ................... | 365/189.05 |
| 6,009,039 A | * | 12/1999 | Takemae et al. ............. | 365/233 |

FOREIGN PATENT DOCUMENTS

| | | |
|---|---|---|
| JP | 2-203611 | 8/1990 |
| JP | 8-17182 | 1/1996 |

* cited by examiner

Primary Examiner—David Nelms
Assistant Examiner—Gene N. Auduong
(74) Attorney, Agent, or Firm—Morrison & Foerster LLP

(57) ABSTRACT

A synchronous semiconductor storage device which operates in synchronization with a system clock signal includes: a first feedback loop which latches an address data signal; a first latch circuit including a first transfer gate which controls the latching by the first feedback loop of the address data signal; a second feedback loop which holds the address data signal latched by the first feedback loop; a second latch circuit including a second transfer gate which controls the holding by the second feedback loop of the address data signal latched by the first feedback loop; a data input control signal generation circuit for generating a data input control signal based on the system clock signal and control signals; and an address latch signal generation circuit for generating an address latch signal from a logical sum of the system clock signal and the data input control signal, wherein the address latch signal is input to the first transfer gate to control the latching of the address data signal, and the data input control signal is input to the second transfer gate to control the holding of the address data signal latched by the first feedback loop.

7 Claims, 13 Drawing Sheets

SEMICONDUCTOR STORAGE DEVICE

BACKGROUND OF THE INVENTION

1. Field of the Invention

The present invention relates to a semiconductor storage device, and specifically to a semiconductor storage device having an input data hold circuit which operates in synchronization with a rising edge of a system clock signal.

2. Description of the Related Art

In recent years, along with the increase in operation speed of microprocessors, etc., demand for semiconductor storage devices which operate at higher speed has been growing. A semiconductor storage device developed for the purpose of meeting such a demand is a synchronous semiconductor storage device that operates in a synchronous burst operation mode. In such a storage device, high speed readout of data is achieved in addition to the increase in speed for normal random access, although an access method is limited to some extent.

The synchronous burst operation mode used in a clock synchronous semiconductor storage device is a high speed access mode in which predetermined data rows are sequentially output in synchronization with a system clock signal.

One example of a synchronous semiconductor storage device which operates in a synchronous burst operation mode includes a synchronous DRAM (hereinafter, referred to as "SDRAM"). In an SDRAM, upon receiving the system clock signal, an input circuit receives, in synchronization with a rising edge of the pulse of the system clock signal, control signals (a row address strobe signal, a column address strobe signal, a write enable signal, and a chip select signal) and an address signal from outside in a time-division manner.

When the control signals and the address signal are received in synchronization with a rising edge of a system clock signal, it is necessary that the control signals and the address signal are input with consideration for a certain setup time and a certain hold time with respect to the rising edge of the system clock signal. In high speed devices such as SDRAMs developed in the recent years, as the frequency of the system clock signal increases, the setup time and the hold time are reduced. Thus, in the margin settings of the setup time and the hold time based on the specification of a storage device, a reduction in dead time is demanded more than ever.

For the purpose of meeting such a demand, a structure of a flip-flop for latching a data signal, which compensates for the setup time, has been proposed. In general, it is necessary to delay an internal clock signal when an input data signal and a system clock signal are input so that waveforms of these two signals rise up at almost the same timing. However, such a delay of the internal clock signal delays the output of data. In the proposed structure, the difference between a delay of the control signals and the address signal in an input data latch circuit section and a delay of a rising edge of the system clock signal is eliminated, whereby the setup time is compensated.

FIG. 8 shows a latch circuit 800 disclosed in Japanese Laid-Open Publication No. 2-203611. In the latch circuit 800, a chip select signal CS, and an address signal (A0-Ax) are input to a logic circuit 204 through a CS input buffer 202 and an address buffer 203, respectively. The logic circuit 204 outputs a signal φ204 to a latch circuit 20. The latch circuit 20 includes a transfer gate 21a, a transfer gate 22a, an inverter INV21, an inverter INV22, an inverter INV23, an inverter INV24, and an inverter INV25. The transfer gate 21a includes an NMOS transistor N21 and a PMOS transistor P21. The transfer gate 22a includes an NMOS transistor N22 and a PMOS transistor P22.

Upon receiving a clock signal CLK, a CLK input buffer 205 outputs a CLK input buffer output signal φ205. A delay circuit 201 receives the CLK input buffer output signal φ205 and outputs a signal φ201 to the transfer gate 21a and the transfer gate 22a. Specifically, the signal φ201 is input directly to a gate of the PMOS transistor P21 and a gate of the NMOS transistor N22, and input through the inverter INV25 to a gate of the NMOS transistor N21 and a gate of the PMOS transistor P22.

The signal φ204 from the logic circuit 204 is supplied to the transfer gate 21a of the latch circuit 20. A signal output from the transfer gate 21a is supplied to the inverter INV21. A signal output from the inverter INV21 is supplied to the transfer gate 22a and is also fed back to the inverter INV21 through the inverter INV22. An output of the transfer gate 22a is output from the latch circuit 20 through a feedback loop formed by the inverter INV23 and the inverter INV24, and supplied to a transfer gate 23a.

The signal output from the delay circuit 201 is also supplied through an inverter INV26 to one of input terminals of a NAND gate NAND21. The other input terminal of the NAND gate NAND21 receives the CLK input buffer output signal φ205 from the CLK input buffer 205. An output of the NAND gate NAND21 is supplied to gates of the transfer gate 23a and gates of a transfer gate 24a. The transfer gate 23a includes an NMOS transistor N23 and a PMOS transistor P23. The transfer gate 24a includes an NMOS transistor N24 and a PMOS transistor P24. The output of the NAND gate NAND21 is supplied directly to a gate of the NMOS transistor N23 and a gate of the PMOS transistor P24, and is also supplied through the inverter INV27 to a gate of the PMOS transistor P23 and a gate of the NMOS transistor N24. The signal φ204 from the logic circuit 204 is also supplied to the transfer gate 24a. A buffer Buf21 receives an output of the transfer gate 23a and an output of the transfer gate 24a, and outputs a signal φ21.

In the latch circuit 800 having the above structure, an internal clock signal is delayed so as to obtain a margin for a setup time, whereby the delay of the input data signal (A0-Ax) with respect to the internal clock signal is eliminated.

Specifically, in the latch circuit 20 whose setup time determined based on the specification of the latch circuit 20 is 0, the input data signal (A0-Ax) and the system clock signal CLK arrive at the latch circuit 20 at the same time. Utilizing this, the system clock signal is delayed by the delay circuit 201 to generate an internal clock signal. Until the input data signal (A0-Ax) is latched based on the internal clock signal, the already-arrived input data signal (A0-Ax) is routed through a path different from the latch circuit 20, i.e., through the transfer gate 23a and the transfer gate 24a (which have been turned on), and are output from the buffer Buf21.

According to this system, the address data signals are input under the timing control of data input control command signals (RAS, CAS, WE, and CS). Therefore, it is required to hold the address data signal when the data input control command signals are input, in order to obtain an input data signal for internal access. For the purpose of solving such a problem, an input data hold circuit 900 (FIG. 9) further including a latch circuit 51 for holding signals has been proposed.

In the input data hold circuit 900, a signal φ52 generated by a latch circuit 53 having the same structure as that of the latch circuit 800 as shown in FIG. 8 is supplied to a latch circuit 51. The latch circuit 51 includes a transfer gate 55a, a transfer gate 56a, an inverter INV59, an inverter INV510, an inverter INV511, an inverter INV512, an inverter INV513. The transfer gate 55a includes an NMOS transistor N55 and a PMOS transistor P55. The transfer gate 56a includes an NMOS transistor N56 and a PMOS transistor P56.

The signal φ52 generated by the latch circuit 53 is supplied to the transfer gate 55a. An input data control signal φ120 is supplied to a gate of the PMOS transistor P55 and a gate of the NMOS transistor N56. Furthermore, the input data control signal φ120 is also supplied to a gate of the NMOS transistor N55 and a gate of the PMOS transistor P56 through the inverter INV513.

An output of the transfer gate 55a is supplied to the inverter INV59. An output of the inverter INV59 is supplied to the transfer gate 56a and is also fed back to the inverter INV59 through the inverter INV510. An output of the transfer gate 56a is supplied to a feedback loop formed by the inverter INV511 and the inverter INV512, and then, the latch circuit 51 outputs signals Ain0-Ainx from the inverter INV511.

The input data hold circuit 900 having the above structure is relatively large in size. Furthermore, since the internal clock signal used for latching in the latch circuit 50 is delayed by the delay circuit 501, the internal access time is delayed accordingly for the same length of time.

In addition to such problems, in the input data hold circuit 900, it is required to provide an input data control signal generation circuit 1000 (see FIG. 10) for generating the input data control signal φ120 in order to hold an input data address signal when the data input control command signal is input. FIG. 11 shows a timing chart of the input data hold circuit 900. As seen from FIG. 11, the internal access time is the sum of the delay time caused by the input data control signal generation circuit 120 (FIG. 10) and input buffers associated therewith, the delay time caused by the logic circuit 504 and input buffers associated therewith, and the delay time caused by the latch circuit 51.

Japanese Laid-Open Publication No. 8-17182 discloses a structure which shortens the internal access time. In this structure, when the setup time based on the specification is several nanoseconds, a part of the setup time is allocated to the internal access time, whereby the internal access time is shortened.

FIG. 12 shows a logic data input latch circuit 1200 disclosed in Japanese Laid-Open Publication No. 8-17182. In the logic data input latch circuit 1200, a chip select signal CS and address signal (A0-Ax) are supplied to logic circuit 74 through a CS input buffer 72 and an address buffer 73, respectively. The logic circuit 74 output a signal φ74 to a latch (flip-flop) circuit 70. The latch (flip-flop) circuit 70 includes a transfer gate 71a, a transfer gate 72a, an inverter INV71, an inverter INV72, an inverter INV73, an inverter INV74, and an inverter INV75. The transfer gate 71a includes an NMOS transistor N71 and a PMOS transistor P71. The transfer gate 72a includes an NMOS transistor N72 and a PMOS transistor P72. The latch (flip-flop) circuit 70 receives the signal φ74 from the logic circuit 74 at the transfer gate 71a. A CLK input buffer 71 receives a system clock signal CLK and outputs a CLK input buffer output signal φ71 to a gate of PMOS transistor P71 and a gate of NMOS transistor N72. The CLK input buffer output signal φ71 is also supplied to a gate of the NMOS transistor N71 and a gate of the PMOS transistor P72 through the inverter INV75. An output of the transfer gate 71a is supplied to the inverter INV71. An output of the inverter INV71 is supplied to the transfer gate 72a and is also fed back to the inverter INV71 through the inverter INV72. An output of the transfer gate 72a is supplied to a feedback loop formed by the inverter INV73 and the inverter INV74, and then, an output of the inverter INV73 is output as a signal φ75.

In the logic data input latch circuit 1200, the logic circuit 74, which receives the input (address) data signals through the address buffer 73, and an interconnection associated therewith are positioned before the latch (flip-flop) circuit 70. In such a structure, the delay time caused by the logic circuit 74 and the interconnection associated therewith is interleaved with the setup time, and the time consumed from a rising edge of the system clock signal CLK to the exit of an output signal φ75 from the latch circuit 70 is shortened.

In the logic data input latch circuit 1200, the delay time caused to the data address signal (A0-Ax) in the path from the address buffer 73 to the latch (flip-flop) circuit 70 is longer than the delay time caused to the system clock signal CLK in the path from the CLK input buffer 71 to the latch (flip-flop) circuit 70 by the delay time caused by the logic circuit 74 and the interconnection associated therewith. In such a case, if the system clock signal CLK and the data address signal (A0-Ax) are input at the same time (i.e., if the signal φ71 and the signal φ73 are output at the same time from the CLK input buffer 71 and the address buffer 73, respectively), in view of the timing of latching the data address signal (A0-Ax) by the latch (flip-flop) circuit 70, the delay time caused by the logic circuit 74 and the interconnection associated therewith reduces the margin of the setup time.

Thus, in the above circuit structure, the delay time caused by the logic circuit 74 and the interconnection associated therewith should be shorter than the setup time.

Furthermore, in a synchronous semiconductor storage devise such as an SDRAM, address data signals are generally input under the timing control of data input control command signals. Therefore, in addition to securing sufficient margins for the setup time and the hold time by the latch (flip-flop) circuit 70, the address data signals input in synchronization with a rising edge of the system clock signal must be held when the data input control command signals are input. Thus, it is necessary to provide, subsequent to the latch (flip-flop) circuit 70, a flip-flop circuit for holding the address data signal (for example, a flip-flop circuit 802 shown in FIG. 13).

An input data hold circuit 1300 as shown in FIG. 13 has a two-stage flip-flop circuit 80 including flip-flop circuits 801 and 802. Such a two-stage structure enables the input data hold circuit 1300 to hold the address data signal. The structure of the flip-flop circuit 802 additionally provided for holding the address data signal is the same as that of the latch circuit 51 shown in FIG. 9.

FIG. 14 shows a timing chart for the input data hold circuit 1300. As seen from this chart, the internal access time is the sum of the delay time caused by the logic circuit 84 and input buffers associated therewith, the delay time caused by the input data control signal generation circuit 120 (FIG. 10) and input buffers associated therewith, and the delay time caused by the latch circuit 802.

In the flip-flop circuit 80 shown above, the address data signal latched by the flip-flop circuit 801 at a rising edge of the system clock signal is held based on the input data control signal φ120 generated by the input data control signal generation circuit 1000 (see FIG. 10) which receives the system clock signal CLK and the data input control command signals. Then, the address data signal is supplied to an internal circuit (a memory section of the storage device) through the inverter INV88.

In such a case, the input data control signal φ120 includes the delay time caused by the input data control signal generation circuit 1000 with respect to a rising edge of the system clock signal. However, since sufficient margins of the setup time and the hold time are secured by the flip-flop circuit 801, the address data signal input in synchronization with a rising edge of the system clock signal is held until the subsequent rising edge of the system clock signal. Thus, the address data signal including a margin of about one cycle of the system clock signal can be held by the flip-flop circuit 802.

However, the flip-flop circuit 80 is relatively large in size because it includes two flip-flop circuits. Furthermore, this flip-flop circuit is provided for each address data signal. Thus, this circuit occupies a relatively large area on a semiconductor chip.

The flip-flop circuit 80 shown in FIG. 13 requires two flip-flop circuits (801 and 802) because the system clock signal CLK is used to latch an input data signal. In the case where the system clock signal CLK is replaced with a clock signal having a single pulse (which has been generated from an externally provided clock input signal having a series of pulses in response to the data input control command input signal) to latch an input data signal, the input data signal can be latched and held by a single flip-flop circuit 901 as shown in FIG. 15. In FIG. 15, in place of the clock signal CLK externally supplied through the CLK input buffer 71 to the logic data input latch circuit 1200 (FIG. 12), the input data control signal φ120 is supplied to a flip-flop circuit 901.

However, in FIG. 15, it is necessary to provide a logic circuit 126 (FIG. 10) for generating a clock signal of a single pulse from an externally supplied clock signal having a series of pulses. The generated clock signal having a single pulse includes a delay time caused by the logic circuit 126. That is, the increase in internal access speed, which is a feature of the circuit disclosed in Japanese Laid-Open Publication No. 8-17182, cannot be achieved. Moreover, in the case where the delay time caused by the logic circuit 126 for generating a clock signal having a single pulse is longer than the delay time caused by the logic circuit 94 (FIG. 15) which is subsequent to the initial stage to which data input addresses are supplied, a margin of the hold time is reduced.

In a clock synchronous semiconductor device, an input data signal is input in synchronization with a rising edge of a clock signal. Therefore, a sufficient setup time and hold time must be secured for inputting the input data signal. However, in the input data hold circuit 1300 (FIG. 13), the number of logic circuit stages is different between a path for the clock signal from its input terminal to a latch circuit and a path for the input data signal from its input terminal to the latch circuit, and this difference in the number of stages causes a skew between these signals. This skew reduces a margin of the setup time and the hold time. Therefore, it is desirable that the number of logic circuit stages is the same between the paths to the latch circuit for the clock signal and for the input data signal. However, in the input data hold circuit 1300, the number of logic circuit stages is larger in the path for the input data signal than in the path for the system clock signal, and thus, a margin of the setup time is reduced.

Alternatively, in the input data hold circuit 900 (FIG. 9), a skew between a clock signal and an input data signal can be eliminated by inserting a logic in a path for the clock signal to a latch circuit so that the number of logic circuits in the path for the clock signal to the latch circuit is the same as those in the path for the input data signal to the latch circuit. However, in such a structure, although a margin can be secured for the setup time and the hold time, the insertion of the logic circuits for the purpose of eliminating the skew increases a dead time, and accordingly, the internal access time is increased.

SUMMARY OF THE INVENTION

According to one aspect of the present invention, a synchronous semiconductor storage device which operates in synchronization with a system clock signal includes: a first feedback loop which latches an address data signal; a first latch circuit including a first transfer gate which controls the latching by the first feedback loop of the address data signal; a second feedback loop which holds the address data signal latched by the first feedback loop; a second latch circuit including a second transfer gate which controls the holding by the second feedback loop of the address data signal latched by the first feedback loop; a data input control signal generation circuit for generating a data input control signal based on the system clock signal and control signals; and an address latch signal generation circuit for generating an address latch signal from a logical sum of the system clock signal and the data input control signal, wherein the address latch signal is input to the first transfer gate to control the latching of the address data signal, and the data input control signal is input to the second transfer gate to control the holding of the address data signal latched by the first feedback loop.

In one embodiment of the present invention, the control signals include a row address strobe signal, a column address strobe signal, a write enable signal, and a chip select signal.

In another embodiment of the present invention, the synchronous semiconductor storage device further includes a logic circuit for generating a data signal to be latched by the first latch circuit based on the chip select signal and the input address signal.

In still another embodiment of the present invention, a delay time caused by the address latch signal generation circuit is equal to a delay time caused by the logic circuit.

In still another embodiment of the present invention, a falling edge of the data input control signal is within a low period of the system clock signal in the same cycle.

In still another embodiment of the present invention, the synchronous semiconductor storage device includes a plurality of first latch circuits and a plurality of second latch circuits so as to latch a plurality of address data signals at the same time.

In still another embodiment of the present invention, the data input control signal generation circuit and the address latch signal generation circuit each have a function of a buffer.

According to the present invention having the above structure, a logic circuit and interconnections which are required before a latch circuit that latches an input data signals are provided in paths to the latch circuit for a system clock signal and a input data signal so that the delay time caused to the system clock signal is the same as that caused to the input address signal, whereby a skew between the system clock signal and the input address signal does not occur. As a result, sufficient margins can be secured for a setup time and a hold time when the input data signal is latched. In addition, the input data signal latched after it has been delayed by a data input control signal generation circuit can be held, and therefore, the internal access speed is relatively high.

Furthermore, a circuit having the above features can be formed relatively small in size. Therefore, the circuit does not increase the size of an entire device as compared to the conventional structure.

Thus, the invention described herein makes possible the advantage of providing an input data latch circuit in which a sufficient setup time and hold time with respect to the system clock signal are secured, and at the same time, the internal access speed is increased without increasing the size of an entire device.

This and other advantages of the present invention will become apparent to those skilled in the art upon reading and understanding the following detailed description with reference to the accompanying figures.

DESCRIPTION OF THE PREFERRED EMBODIMENTS

Hereinafter, an embodiment of the present invention will be described with reference to the drawings.

Figure 1:
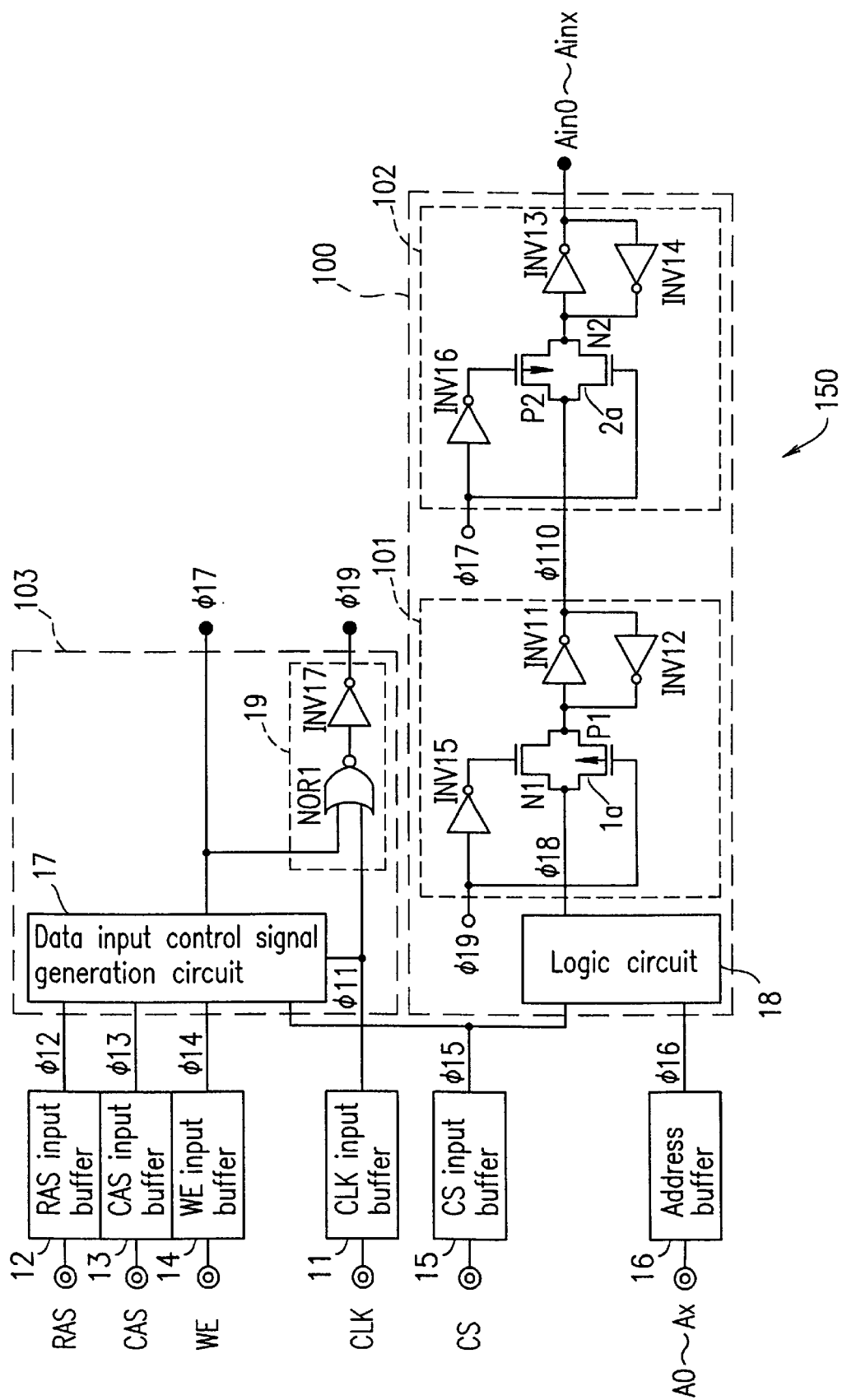
FIG. 1 shows an embodiment of an input data hold circuit which is used in a synchronous semiconductor storage device according to the present invention.
Figure 2:
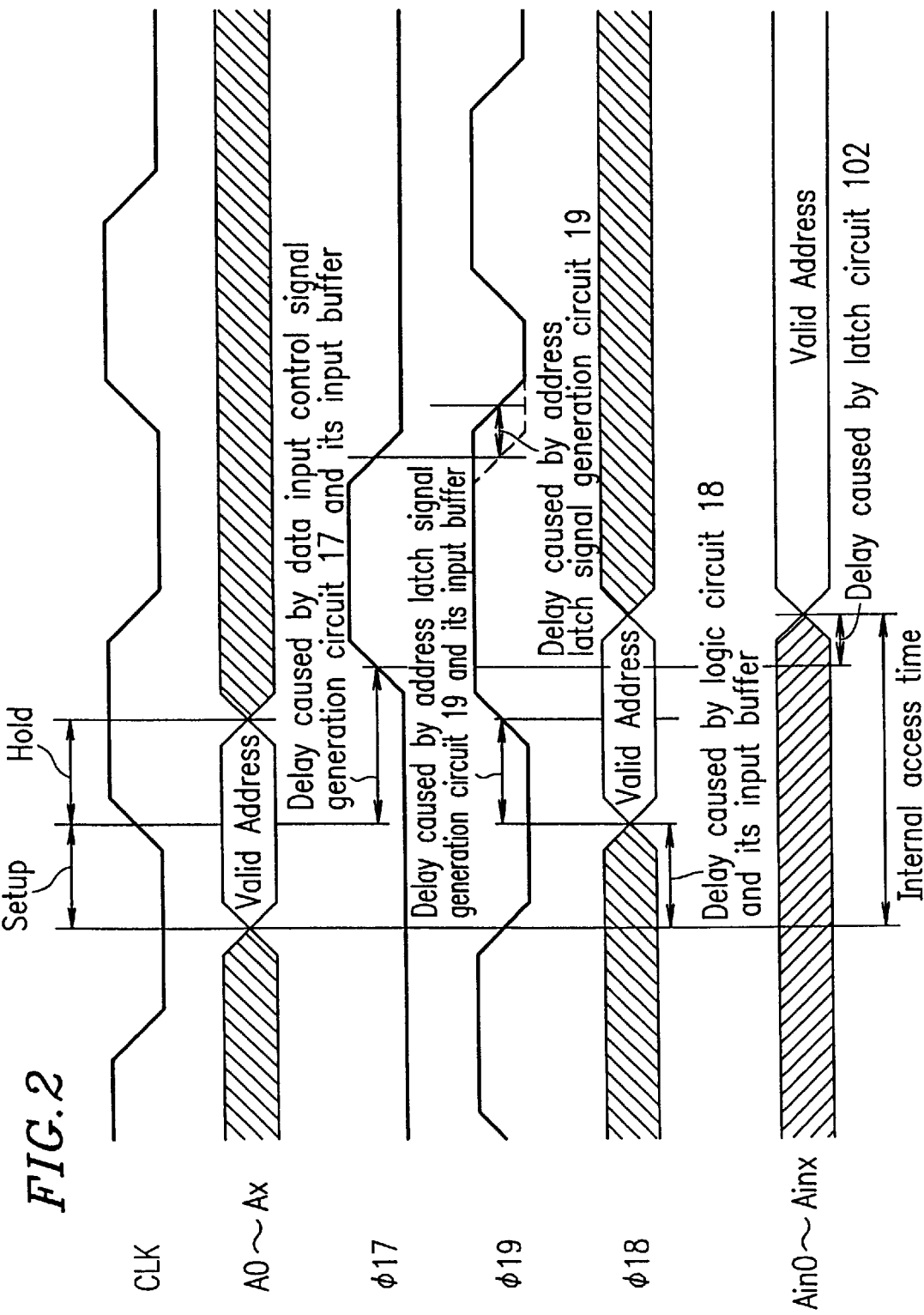
FIG. 2 is a timing chart showing the relationship of waveforms of signals used in the input data hold circuit shown in FIG. 1.

FIG. 1 shows a structure of an input data hold circuit which is used in a synchronous semiconductor storage device according to the present invention. FIG. 2 is a timing chart showing the relationship of waveforms of signals used in the input data hold circuit shown in FIG. 1.

FIG. 1 shows an input data hold circuit 150 used in a synchronous semiconductor storage device according to the present invention. The input data hold circuit 150 includes a CLK input buffer 11, an RAS input buffer 12, a CAS input buffer 13, a WE input buffer 14, a CS input buffer 15, an address buffer 16, an input data latch signal generation circuit 103, and a D-type flip-flop circuit 100 having a hold function. The input data hold circuit 150 has six terminals for receiving six input signals, i.e., a row address strobe signal RAS, a column address strobe signal CAS, a write enable signal WE, a system clock signal CLK, a chip select signal CS, and address signal (A0-Ax), respectively. The input signals received at the respective input terminal are amplified by the RAS input buffer 12, the CAS input buffer 13, the WE input buffer 14, the CLK input buffer 11, the CS input buffer 15, and the address buffer 16, respectively. Then, the amplified signals are send to internal circuits. The delay times caused to the respective input signals by the respective buffer circuits are the same. Therefore, no skew occurs between the input signals.

The input data latch signal generation circuit 103 includes a data input control signal generation circuit 17 and an address latch signal generation circuit 19. The address latch signal generation circuit 19 includes a NOR gate NOR1 and an inverter INV17. An RAS input buffer output signal $\phi12$ from the RAS input buffer 12, a CAS input buffer output signal $\phi13$ from the CAS input buffer 13, a WE input buffer output signal $\phi14$ from the WE input buffer 14, a CS input buffer output signal $\phi15$ from the CS input buffer 15 are supplied to the data input control signal generation circuit 17 provided in the input data latch signal generation circuit 103. Furthermore, a CLK input buffer output signal $\phi11$ from the CLK input buffer 11 is supplied to the data input control signal generation circuit 17. Based on the CLK input buffer output signal $\phi11$, the RAS input buffer output signal $\phi12$, the CAS input buffer output signal $\phi13$, the WE input buffer output signal $\phi14$, and the CS input buffer output signal $\phi15$, the data input control signal generation circuit 17 generates a data input control signal $\phi17$. The data input control signal $\phi17$ includes a delay caused by the data input control signal generation circuit 17. The data input control signal $\phi17$ is used to hold an input data signal latched by a latch circuit 101, as described below.

The data input control signal $\phi17$ is also supplied to one terminal of the NOR gate NOR1. The other terminal of the NOR gate NOR1 receives a CLK input buffer output signal $\phi11$ from the CLK input buffer 11. An output of the NOR gate NOR1 is output through the inverter INV17 as an address latch signal $\phi19$. That is, the address latch signal $\phi19$ generated by the address latch signal generation circuit 19 is a logical sum of the data input control signal $\phi17$ and the CLK input buffer output signal $\phi11$. The address latch signal $\phi19$ includes a delay caused by the address latch signal generation circuit 19. The address latch signal $\phi19$ is used to hold an input data signal latched by a latch circuit 102, as described below.

The D-type flip-flop circuit 100 having a hold function includes a logic circuit 18, a latch circuit 101, and a latch circuit 102. The latch circuit 101 includes a transfer gate 1a, an inverter INV11, an inverter INV12, and an inverter INV15. The transfer gate 1a includes an NMOS transistor N1 and a PMOS transistor P1. The latch circuit 102 includes a transfer gate 2a, an inverter INV13, an inverter INV14, and an inverter INV16. The transfer gate 2a includes an NMOS transistor N2 and a PMOS transistor P2.

The CS input buffer output signal φ15 from the CS input buffer 15 is also supplied to the logic circuit 18. The address buffer output signal φ16 from the address buffer 16 is supplied to the logic circuit 18. The logic circuit 18 generates a signal φ18 based on the CS input buffer output signal φ15 and the address buffer output signal φ16. The signal φ18 includes a delay caused by the logic circuit 18.

The signal φ18 from the logic circuit 18 is supplied to the transfer gate 1a. A gate of the PMOS transistor P1 receives the address latch signal φ19, and a gate of the NMOS transistor N1 also receives the address latch signal φ19 through the inverter INV15. When the gate of the PMOS transistor P1 goes to a low level "L" and the gate of the NMOS transistor N1 goes to a high level "H", the transfer gate 1a outputs a signal.

The signal output from the transfer gate 1a is supplied to the inverter INV11. An output of the inverter INV11 is supplied to a latch circuit 102 and is also fed back to the inverter INV11 through the inverter INV12. The inverter INV11 and the inverter INV12 forms a first feedback loop.

A signal φ110 output from the first feedback loop is supplied to the transfer gate 2a. A gate of the NMOS transistor N2 of the transfer gate 2a receives the data input control signal φ17, and a gate of the PMOS transistor P2 of the transfer gate 2a also receives the data input control signal φ17 through the inverter INV16.

A signal output from the transfer gate 2a is supplied to the inverter INV13. A signal output from the inverter INV13 is output from the D-type flip-flop circuit 100 and is also fed back to the inverter INV13 through the inverter INV14. The inverter INV13 and the inverter INV14 forms a second feedback loop.

In the input data hold circuit 150 having the above structure shown in FIG. 1, the signal φ18 and the address latch signal φ19 are delayed by the logic circuit 18 and the address latch signal generation circuit 19, respectively, before being supplied to the latch circuit 101. As shown in FIG. 2, in the case where the delay time of the signal φ18 which is caused by the logic circuit 18 and the delay time of the address latch signal φ19 which is caused by the address latch signal generation circuit 19 are equivalent, the delay time caused in the flow from the respective input terminals to the latch circuit 101 is the same for both of these signals φ18 and φ19. In such a case, no skew occurs between the signal φ18 and the address latch signal φ19. Although the signal φ18 is latched by the transfer gate 1a based on the address latch signal φ19, the delay times of the signal φ18 and the address latch signal φ19 are equivalent.

Thus, in the latch circuit 101 formed by the first feedback loop and the transfer gate 1a for latching an address input signal φ16, the output signal φ18 can be latched while the setup time and the hold time which is secured by the input data signal and the clock signal at the input terminal section.

Then, an address data signal generated from the signal φ18 by the latch circuit 101 is latched by the latch circuit 102 formed by the transfer gate 2a and the second feedback loop based on the data input control signal φ17 which has been delayed with respect to the system clock signal at the input terminal. Thus, the internal access speed increases.

Figure 3:
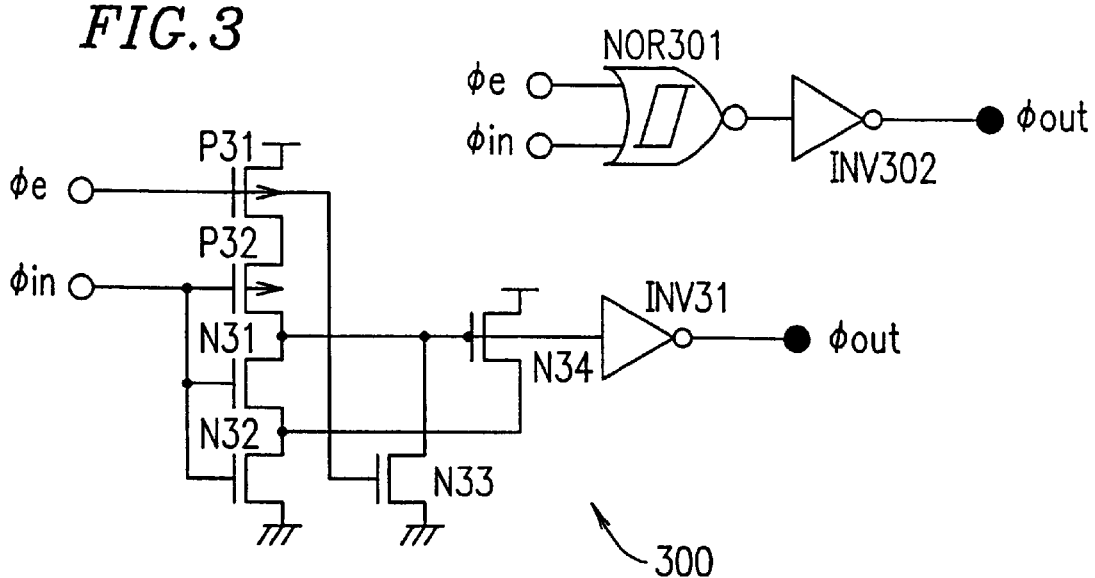
FIG. 3 shows an exemplary structure of an input buffer circuit which is used in the present invention.

FIG. 3 shows an input buffer 300, which is an example of an input buffer functioning as an initial input circuit. In the input buffer 300, the NOR gate 301, which has the hysteresis characteristic, receives a signal φin and an enable signal φe from external terminals. The NOR gate 301 outputs a signal φout through the inverter INV302.

Figure 4:
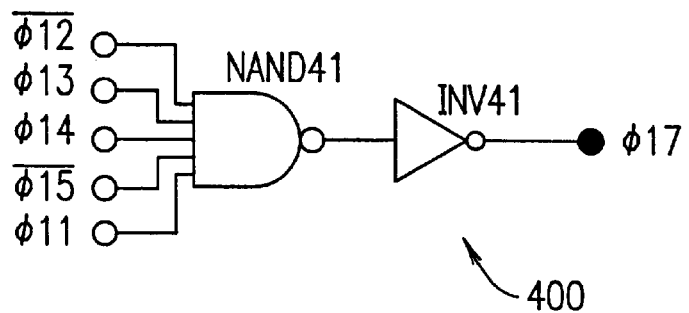
FIG. 4 shows an example of a data input control signal generation circuit according to the present invention, which generates a data input control signal from a control signal and a system clock signal.

FIG. 4 shows a data input control signal generation circuit 400 which generates a data input control signal from a row address strobe signal RAS, a column address strobe signal CAS, a write enable signal WE, a chip select signal CS, and a system clock signal CLK. The data input control signal generation circuit 400 is a serial circuit formed by a five-input NAND gate NAND41 and an inverter INV41, and is logically an AND circuit. The data input control signal generation circuit 400 outputs a logical product of input signals as a data input control signal φ17. Specifically, the data input control signal generation circuit 400 decodes a predetermined command based on the combination of polarities of the received control signals, and a logical product of the decoding result and the clock signal produces a pulse whose maximum pulse width is that of the clock signal.

Figure 5:
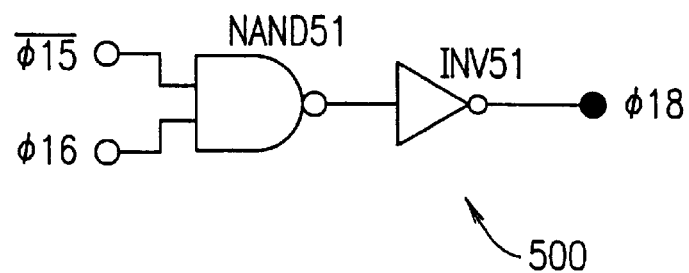
FIG. 5 shows an example of a logic circuit used in a device of the present invention.

FIG. 5 shows a logic circuit 500 which generates a data signal to be latched from the input data signal and the chip select signal CS. The logic circuit 500 is a serial circuit formed by a two-input NAND gate NAND51 and an inverter INV51, and is logically an AND circuit. The logic circuit 500 outputs a logical product of the input signals as a data input control signal φ18. By a function of the logic circuit 500, the input data signal is inactivated while the chip select input signal CS is inactive, whereby an AC current can be reduced in the latch circuit 101.

Figure 6:
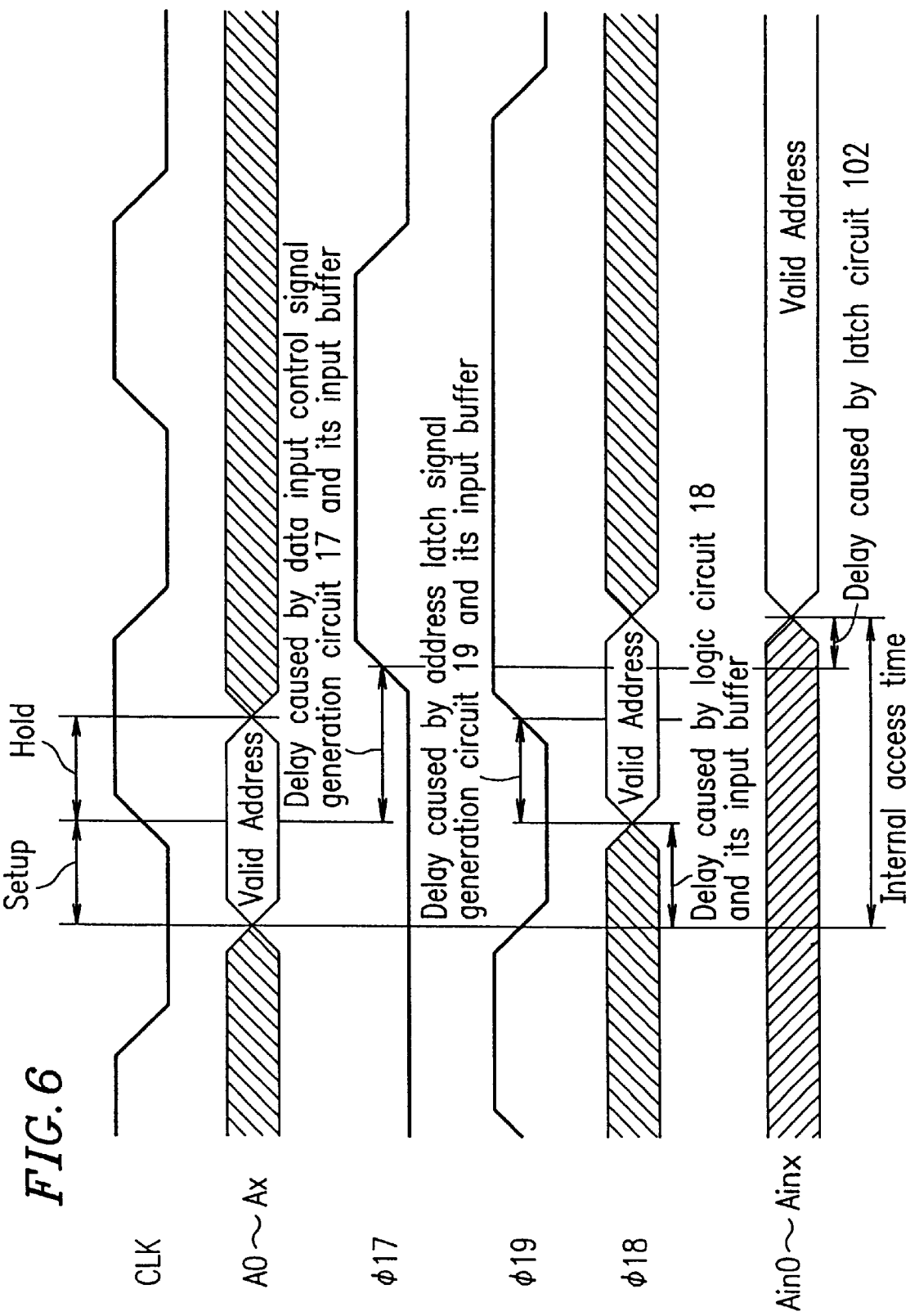
FIG. 6 shows that if the falling edge of the data input control signal is within a high period of the system clock signal in the subsequent cycle, a falling edge of the address latch signal is delayed.

A falling edge of the data input control signal φ17 must be within a low period of the system clock signal in the same cycle. As shown in FIG. 6, if the falling edge of the data input control signal φ17 is within a high period of the system clock signal in the subsequent cycle, a falling edge of the address latch signal φ19 is delayed. When the falling edge of the data input control signal φ17 is appropriately within a low period of the system clock signal in the same cycle, it is possible to continuously input the same command signal.

Figure 7:
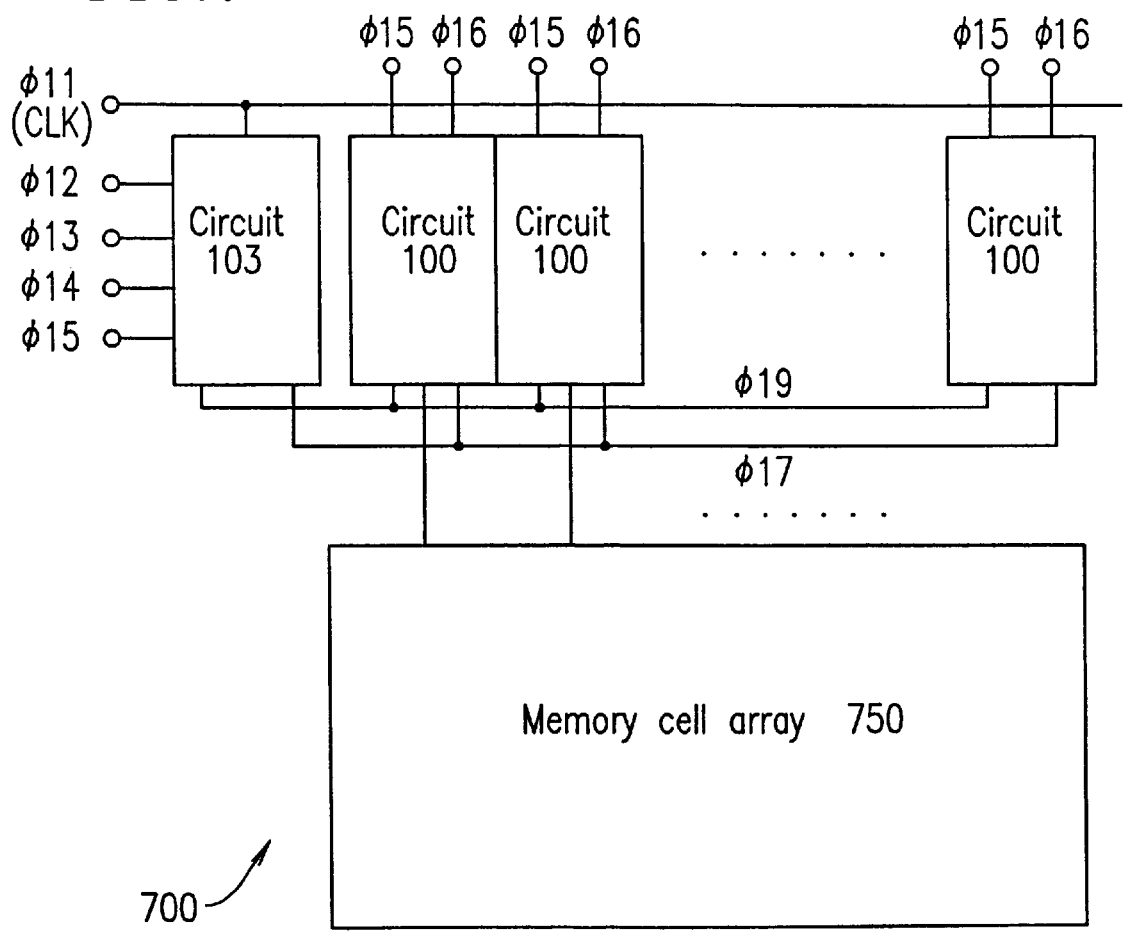
FIG. 7 shows a structure of a plurality of D-type flip-flop circuits having a hold function when used in a synchronous semiconductor storage device according to the present invention.
Figure 8:
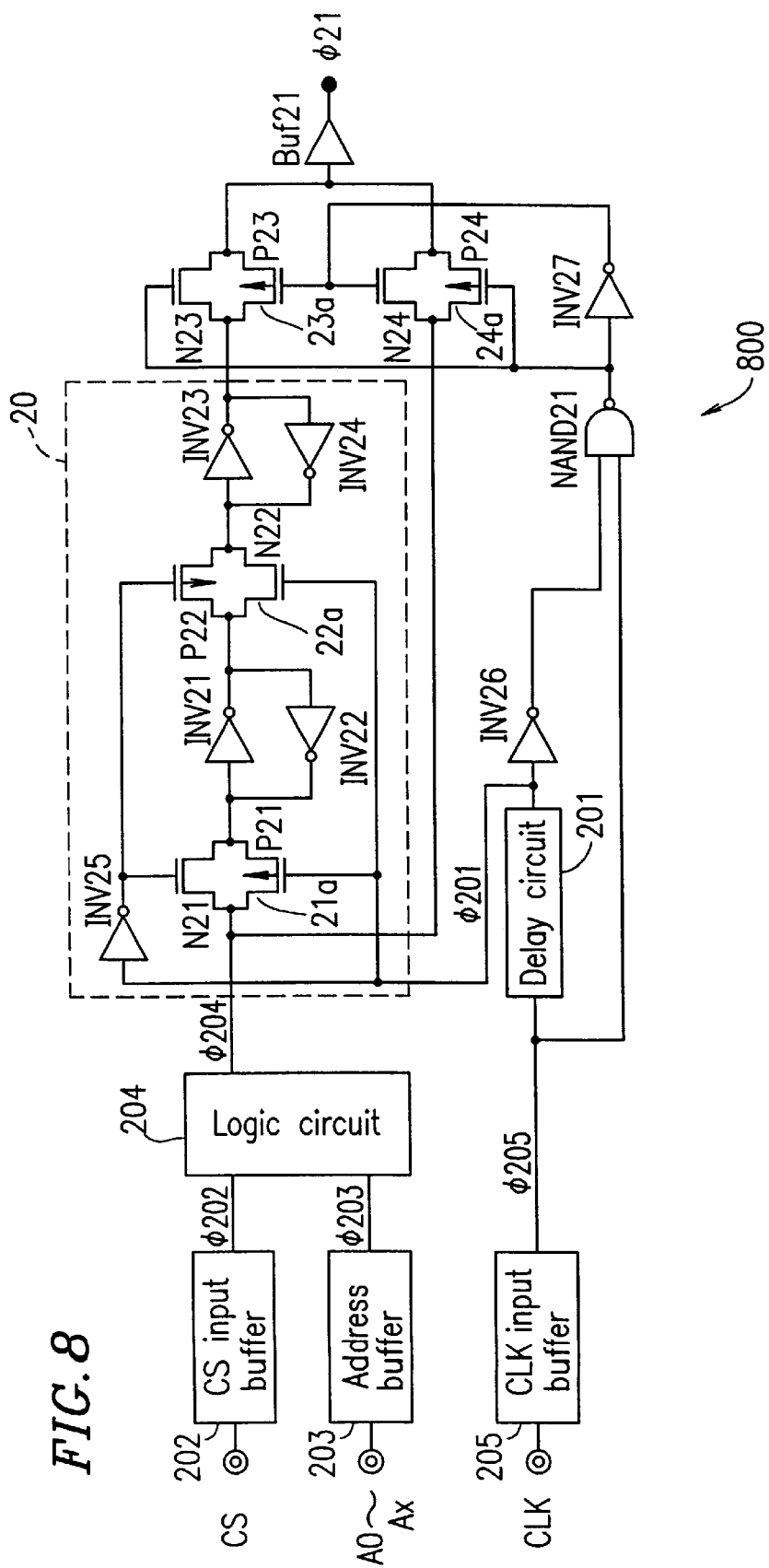
FIG. 8 shows an exemplary structure of a conventional input latch circuit.
Figure 9:
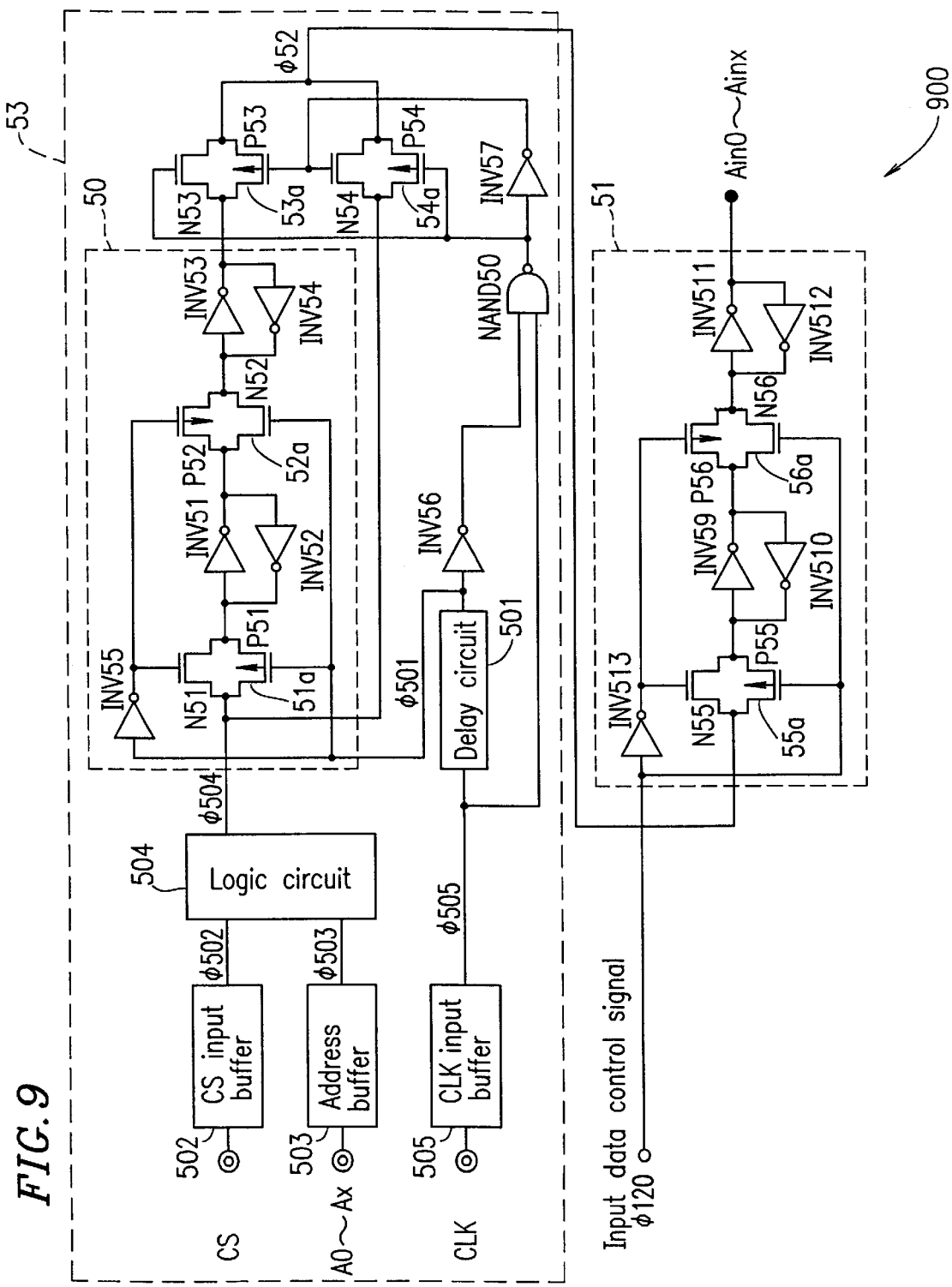
FIG. 9 shows an exemplary structure of a conventional input data hold circuit having an input data hold function.
Figure 10:
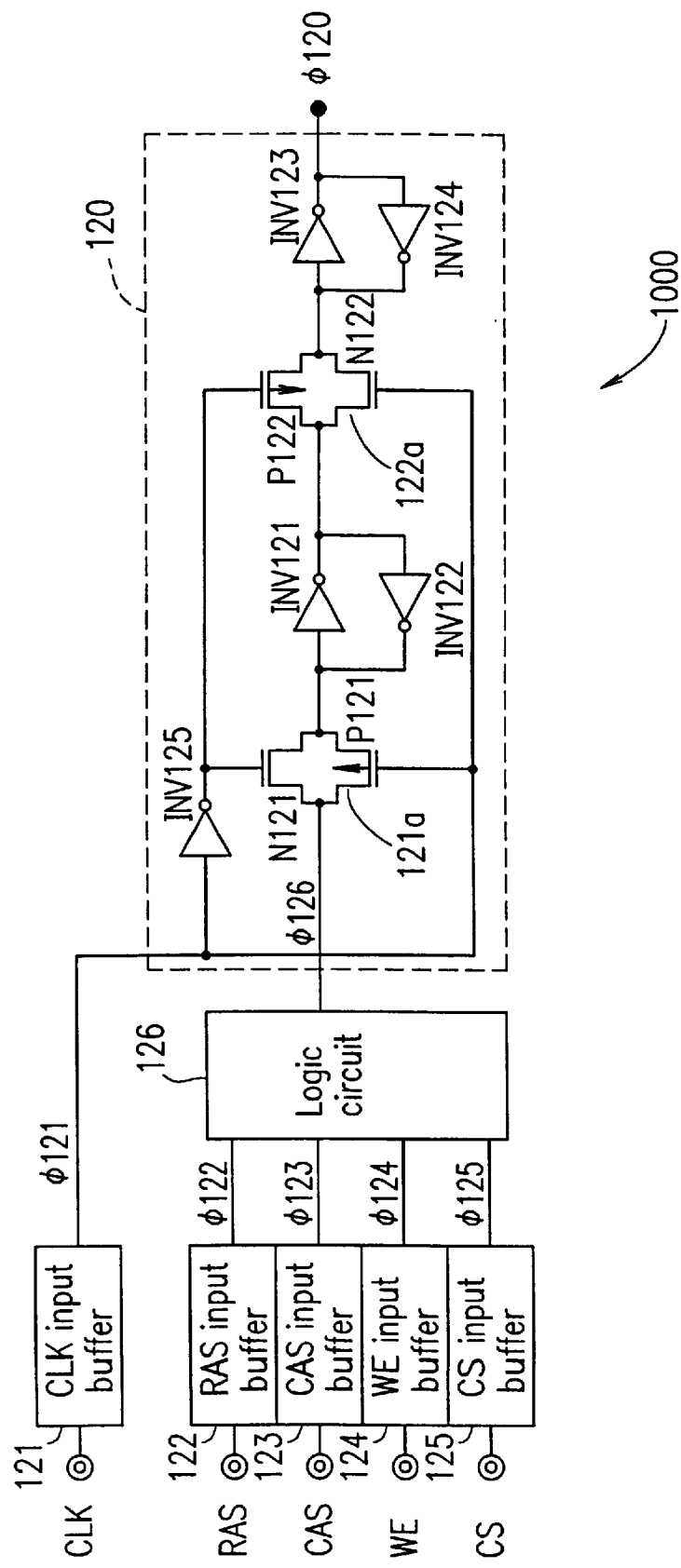
FIG. 10 shows an exemplary structure of a conventional input data control signal generation circuit.
Figure 11:
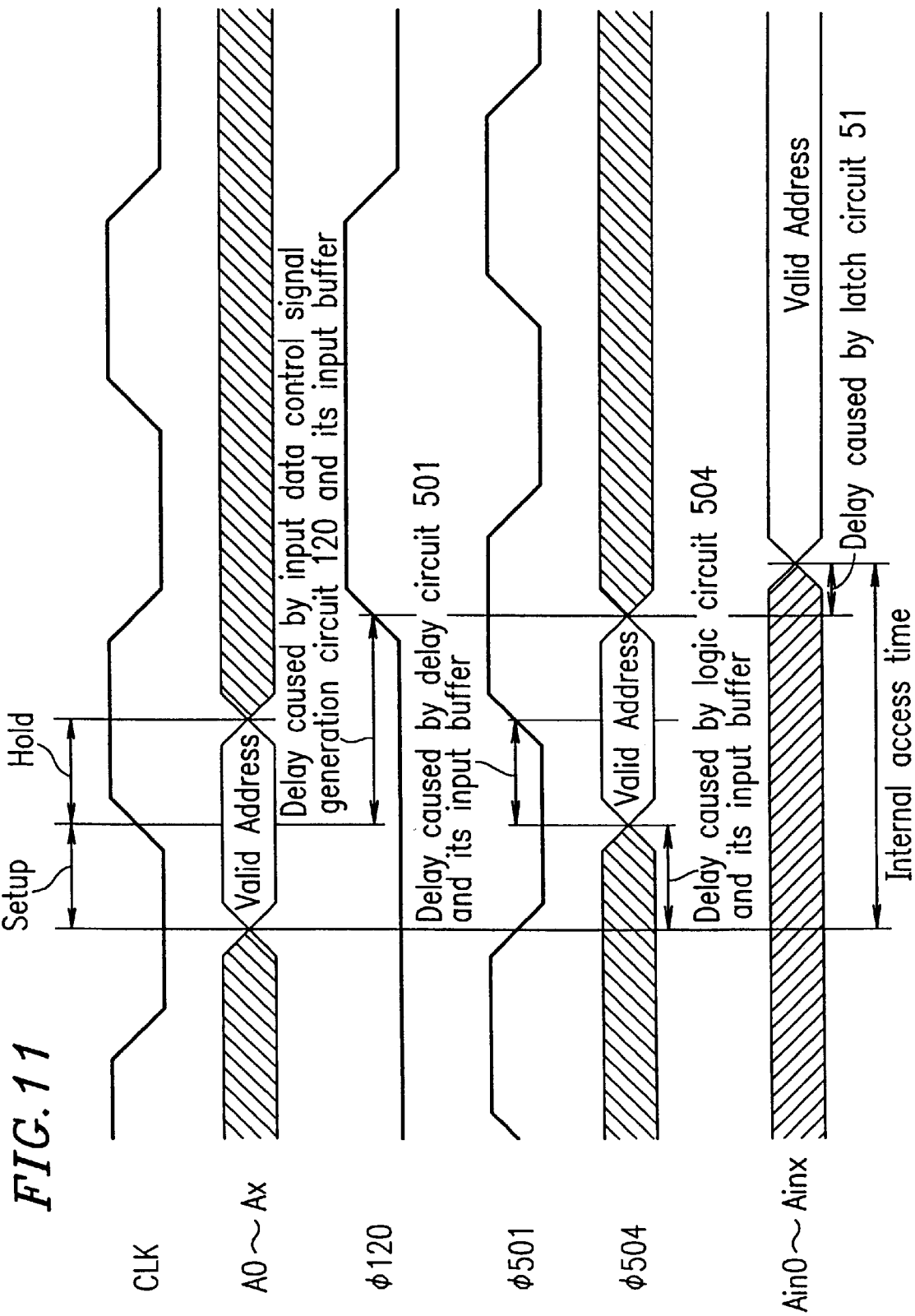
FIG. 11 shows a timing chart of the conventional input data hold circuit shown in FIG. 9.
Figure 12:
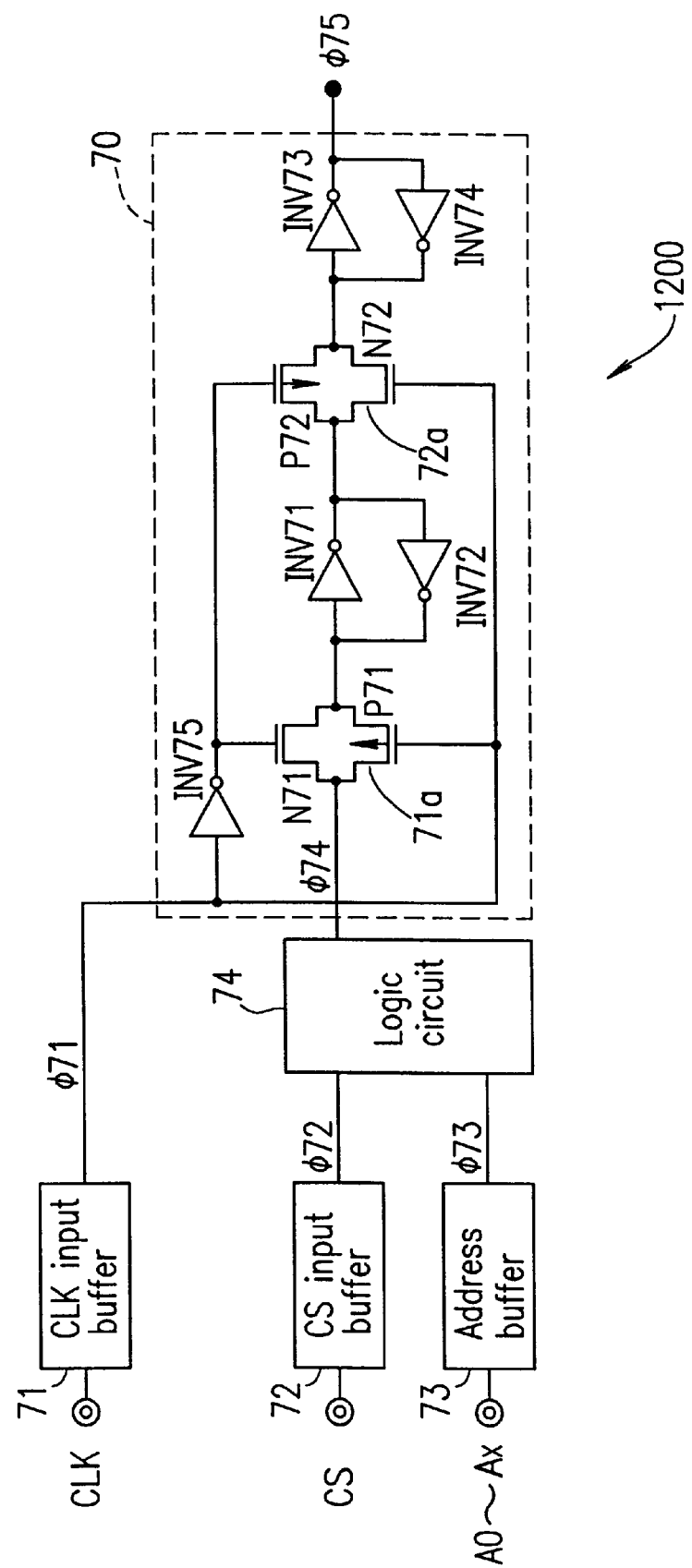
FIG. 12 shows an exemplary structure of a conventional logic data input latch circuit.
Figure 13:
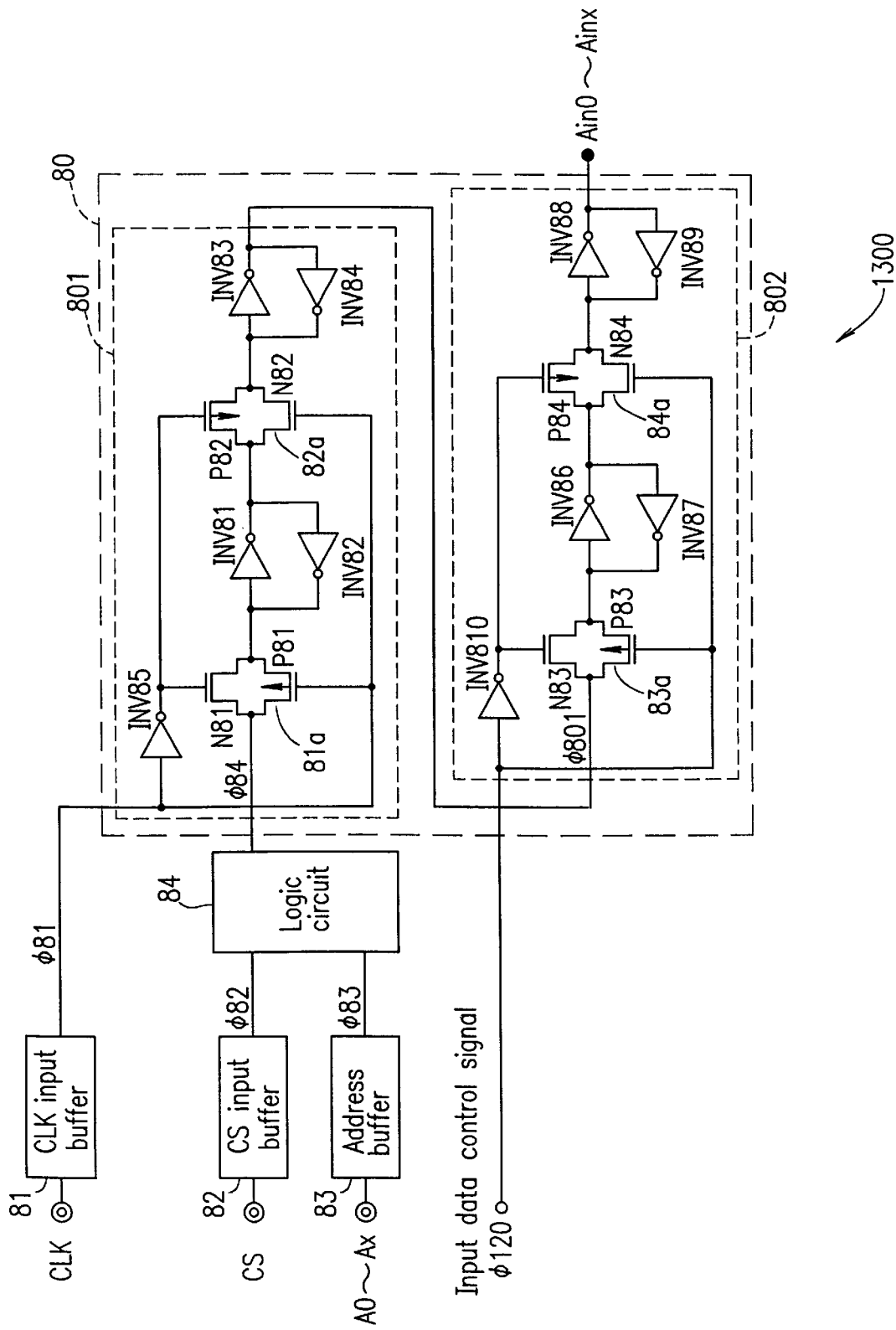
FIG. 13 shows an exemplary structure of a conventional input data hold circuit having a hold function.
Figure 14:
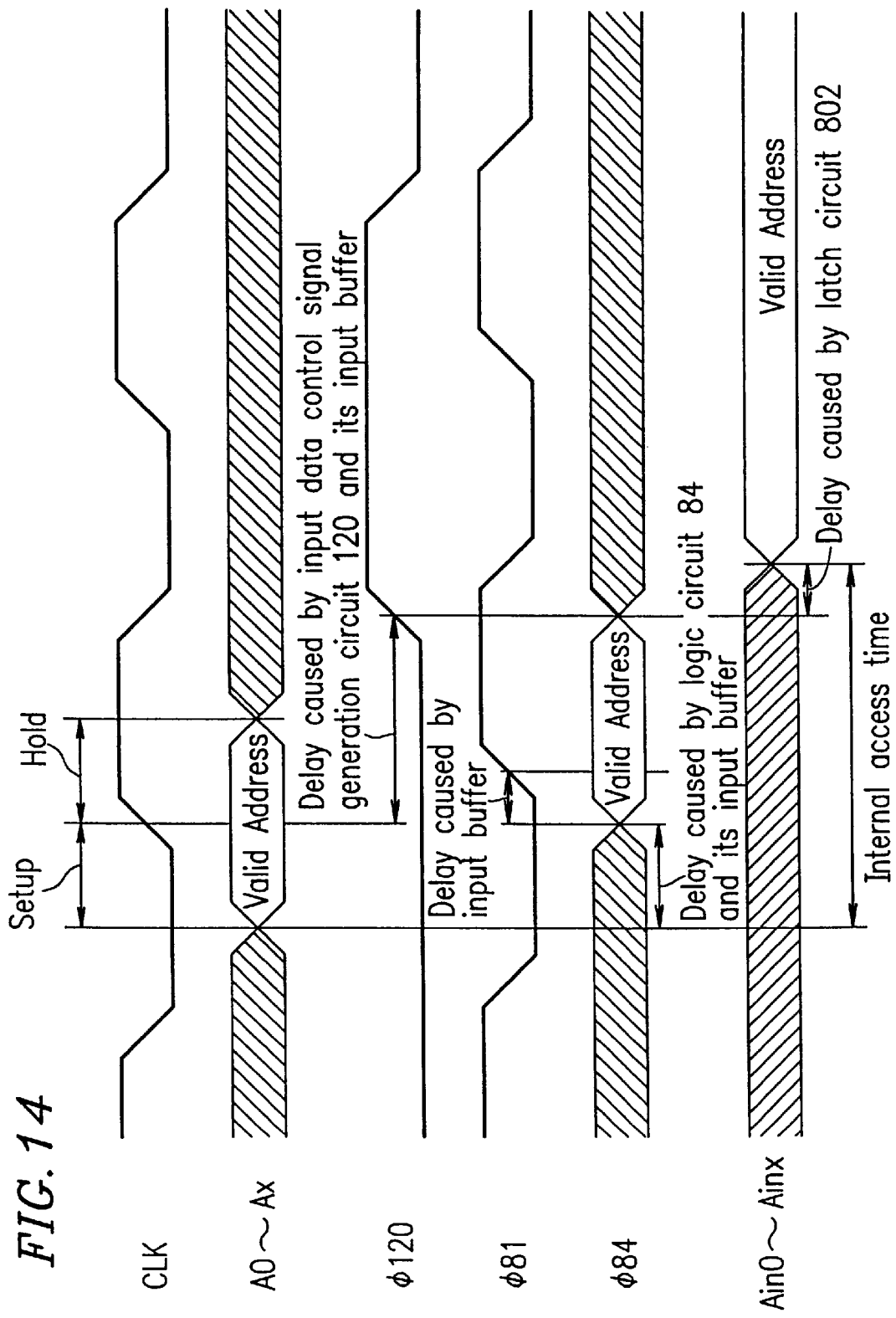
FIG. 14 shows a timing chart for the conventional input data hold circuit shown in FIG. 13.
Figure 15:
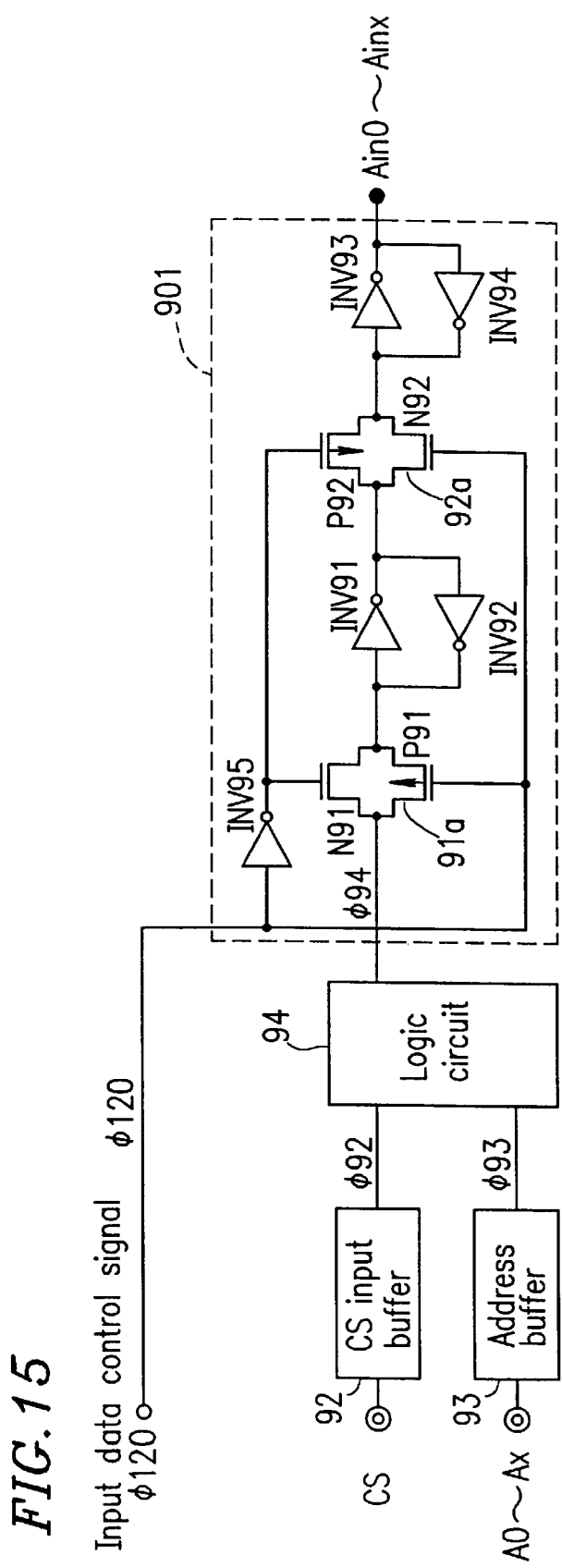
FIG. 15 shows another exemplary structure of a conventional input latch circuit having a function for holding an input data signal.

Now, how to actually use a synchronous semiconductor storage device 700 is described with reference to FIG. 7. The input data latch signal generation circuit 103 receives a CLK input buffer output signal φ11, an RAS input buffer output signal φ12, a CAS input buffer output signal φ13, a WE input buffer output signal φ14, and a CS input buffer output signal φ15, and outputs a data input control signal φ17 and an address latch signal φ19 to a plurality of D-type flip-flop circuits 100 having a hold function. Each of the D-type flip-flop circuits 100 having a hold function is connected to a memory cell array 750.

In general, in the case where a plurality of input signals, e.g., address signals, are latched at the same time, the required number of D-type flip-flop circuits 100 is identical with the number of input signals to be latched at the same time. Therefore, a gate capacitance associated with interconnections for the data input control signal φ17 and the address latch signal φ19 which are input to the D-type flip-flop circuits 100 together with the address signal φ16 and the CS input buffer output signal φ15 is relatively large. Such a large capacitance causes a problem in the case where the system clock signal, etc., is input to the flip-flop circuit 100 without passing through any buffer circuit. As the total of the capacitance associated with the interconnections increases, the waveform of the address signal is accordingly deformed, whereby the access speed is decreased. However, in the input data hold circuit 150 according to the present invention, the data input control signal generation circuit 17 and the address latch signal generation circuit 19 also serve as buffers, whereby a dead time is removed from the internal access time, and therefore, the internal access speed is increased.

According to the present invention, a logic circuit and interconnections which are required for the operation of the entire circuitry are appropriately positioned between input terminals and a latch circuit for latching an input data signal, so that the delay time caused to a system clock signal and the delay time caused to the input data signal between the input terminals and the latch circuit are equivalent. In such a structure, no skew occurs between the system clock signal and the input address signal. As a result, sufficient margins can be secured for a setup time and a hold time when the input data signal is latched. In addition, the input data signal latched after it has been delayed by a data input control signal generation circuit can be held, and therefore, the internal access speed is relatively high.

Furthermore, a circuit having the above features can be formed to be relatively small in size. Therefore, the circuit does not increase the size of an entire device as compared to the conventional structure.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A synchronous semiconductor storage device which operates in synchronization with a system clock signal, comprising:
   a first feedback loop which latches an address data signal;
   a first latch circuit including a first transfer gate which controls the latching by the first feedback loop of the address data signal;
   a second feedback loop which holds the address data signal latched by the first feedback loop;
   a second latch circuit including a second transfer gate which controls the holding by the second feedback loop of the address data signal latched by the first feedback loop;
   a data input control signal generation circuit for generating a data input control signal based on the system clock signal and control signals; and
   an address latch signal generation circuit for generating an address latch signal from a logical sum of the system clock signal and the data input control signal,
   wherein the address latch signal is input to the first transfer gate to control the latching of the address data signal, and
   the data input control signal is input to the second transfer gate to control the holding of the address data signal latched by the first feedback loop.

2. A synchronous semiconductor storage device according to claim 1, wherein the control signals include a row address strobe signal, a column address strobe signal, a write enable signal, and a chip select signal.

3. A synchronous semiconductor storage device according to claim 2, further comprising a logic circuit for generating a data signal to be latched by the first latch circuit based on the chip select signal and the input address signal.

4. A synchronous semiconductor storage device according to claim 3, wherein a delay time caused by the address latch signal generation circuit is equal to a delay time caused by the logic circuit.

5. A synchronous semiconductor storage device according to claim 1, wherein a falling edge of the data input control signal is within a low period of the system clock signal in the same cycle.

6. A synchronous semiconductor storage device according to claim 1, wherein the synchronous semiconductor storage device includes a plurality of first latch circuits and a plurality of second latch circuits so as to latch a plurality of address data signals at the same time.

7. A synchronous semiconductor storage device according to claim 6, wherein the data input control signal generation circuit and the address latch signal generation circuit each have a function of a buffer.

* * * * *